United States Patent
Chyun

(10) Patent No.: US 9,953,119 B2
(45) Date of Patent: *Apr. 24, 2018

(54) METHOD FOR DESIGNING MULTIPLE TUNED FILTER IN HIGH VOLTAGE DIRECT CURRENT SYSTEM

(71) Applicant: LSIS CO., LTD., Anyang-si, Gyeonggi-do (KR)

(72) Inventor: Yi Kyung Chyun, Ansan-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/163,497

(22) Filed: May 24, 2016

(65) Prior Publication Data

US 2017/0032070 A1     Feb. 2, 2017

(30) Foreign Application Priority Data

Jul. 30, 2015   (KR) .................. 10-2015-0108403

(51) Int. Cl.
    *G06F 17/50*        (2006.01)
    *H03H 7/01*         (2006.01)

(52) U.S. Cl.
    CPC .......... *G06F 17/5045* (2013.01); *H03H 7/01* (2013.01); *H03H 7/0115* (2013.01); *H03H 2007/013* (2013.01)

(58) Field of Classification Search
    CPC .... G06F 17/5045; H03H 7/01; H03H 7/0115; H03H 2007/013
See application file for complete search history.

(56) References Cited

U.S. PATENT DOCUMENTS

| | | | | |
|---|---|---|---|---|
| 5,910,889 A | * | 6/1999 | Larsen | ............... H02J 3/01 307/105 |
| 6,208,537 B1 | * | 3/2001 | Skibinski | ............ H02M 1/12 363/40 |

(Continued)

FOREIGN PATENT DOCUMENTS

| | | |
|---|---|---|
| EP | 3018805 | 5/2016 |
| JP | H07241033 | 9/1995 |

(Continued)

OTHER PUBLICATIONS

Pena-Alzola et al.; "Robust Design of LCL-Filters for Active Damping in Grid Converters"; Industrial Electronics Society; IECON 2013—39th Annual Conference of the IEEE; Nov. 10-13, 2013; pp. 1248-1253.*

(Continued)

*Primary Examiner* — Naum B Levin
(74) *Attorney, Agent, or Firm* — K&L Gates LLP

(57) ABSTRACT

A method for designing a multiple tuned filter (MTF) in a high voltage direct current (HVDC) system includes setting an input parameter constituting the MTF; setting a resonance frequency of the MTF; extracting at least one LC combination case constituting the MTF on the basis of the input parameter and the resonance frequency; performing optimization for harmonic reduction on the LC combination case; and extracting an LC combination case determined based on a result obtained by performing the optimization.

8 Claims, 6 Drawing Sheets

(56) References Cited

U.S. PATENT DOCUMENTS

| | | | | |
|---|---|---|---|---|
| 7,499,290 | B1* | 3/2009 | Mazzola | H02M 3/33569 363/17 |
| 8,471,514 | B2* | 6/2013 | Zargari | H02J 3/01 318/448 |
| 8,810,182 | B2* | 8/2014 | Zhou | H02M 1/12 318/494 |
| 2010/0327823 | A1* | 12/2010 | Nisenblat | H02J 3/1828 323/206 |
| 2013/0033907 | A1* | 2/2013 | Zhou | H02M 1/12 363/37 |
| 2016/0126823 | A1* | 5/2016 | Chyun | H02J 3/36 363/44 |
| 2016/0139188 | A1* | 5/2016 | Harary | G01R 21/133 702/61 |
| 2016/0226368 | A1* | 8/2016 | Al-Hokayem | H02M 1/126 |
| 2016/0380556 | A1* | 12/2016 | Peng | H02M 1/12 363/71 |

FOREIGN PATENT DOCUMENTS

| | | |
|---|---|---|
| JP | H0919061 | 1/1997 |
| JP | 2014150602 | 8/2014 |
| JP | 2015019566 | 1/2015 |
| JP | 2015-24136 | 2/2015 |
| JP | 2015-109440 | 6/2015 |
| JP | 2015119538 | 6/2015 |
| KR | 10-0383791 | 4/2003 |
| KR | 10-2006-0038539 | 5/2006 |
| KR | 10-0713814 | 5/2007 |
| KR | 10-0726024 | 5/2007 |
| KR | 10-2012-0054022 | 5/2012 |
| KR | 10-2013-0093406 | 8/2013 |
| KR | 10-1296798 | 8/2013 |
| KR | 10-2013-0141228 | 12/2013 |
| KR | 10-2014-0125213 | 10/2014 |
| KR | 20140130319 | 11/2014 |
| KR | 10-1512188 | 4/2015 |

OTHER PUBLICATIONS

Korean Intellectual Property Office Application Serial No. 10-2015-0108403, Office Action dated May 13, 2016, 5 pages.
Japan Patent Office Application No. 2016-121366, Office Action dated Mar. 7, 2017, 2 pages.
European Patent Office Application Serial No. 16173104.7, Search Report dated Dec. 14, 2016, 8 pages.
Aleem et al., "Optimal C-Type Passive Filter Based on Minimization of the Voltage Harmonic Distortion for Nonlinear Loads," IEEE Transactions on Industrial Electronics, Jan. 2012, 9 pages.
Mohamed et al., "Optimal Sizing of C-Type Passive Filters under Non-Sinusoidal Conditions," Energy Technology & Policy, Aug. 2014, 11 pages.
Klempka, "A New Method for the C-Type Passive Filter Design," Przeglad Elektrotechniczny, 2012, 5 pages.
Japan Patent Office Application No. 2016-121366, Office Action dated Jun. 21, 2017, 2 pages.
Communication Pursuant to Article 94(3) EPC dated Feb. 22, 2018 issued in related EP Patent Application No. 16173104.7-1207; (8 Pages).
Leite Jandecy Cabrai et al: "Planning Passive Filters Using NSGA II for Industry Applications", 2014 11th IEEE/IAS International Conference on Industry Applications, IEEE, Dec. 7, 2014 (Dec, 12, 2014), pages 1-8, XP0327 46684, DOI: 10.1109/INDUSCON.2014. 7059456 [retrieved on Mar. 12, 2015].
Ying-Pin Chung et al: "Design of Harmonic Filters Using Combined Feasible Direction Method and Differential Evolution", 2004 International Conference on Power System Technology—Powercon: Singapore, Nov. 21-24, 2004, IEEE Operations Center, Piscataway, NJ, vol. 1, Nov. 21, 2004 (Nov. 21, 2004), pp. 812-817, XP010812525, DOI: 1 0.11 09/ICPST.2004.14601 05; ISBN: 978-0-7803-8610-5.

\* cited by examiner

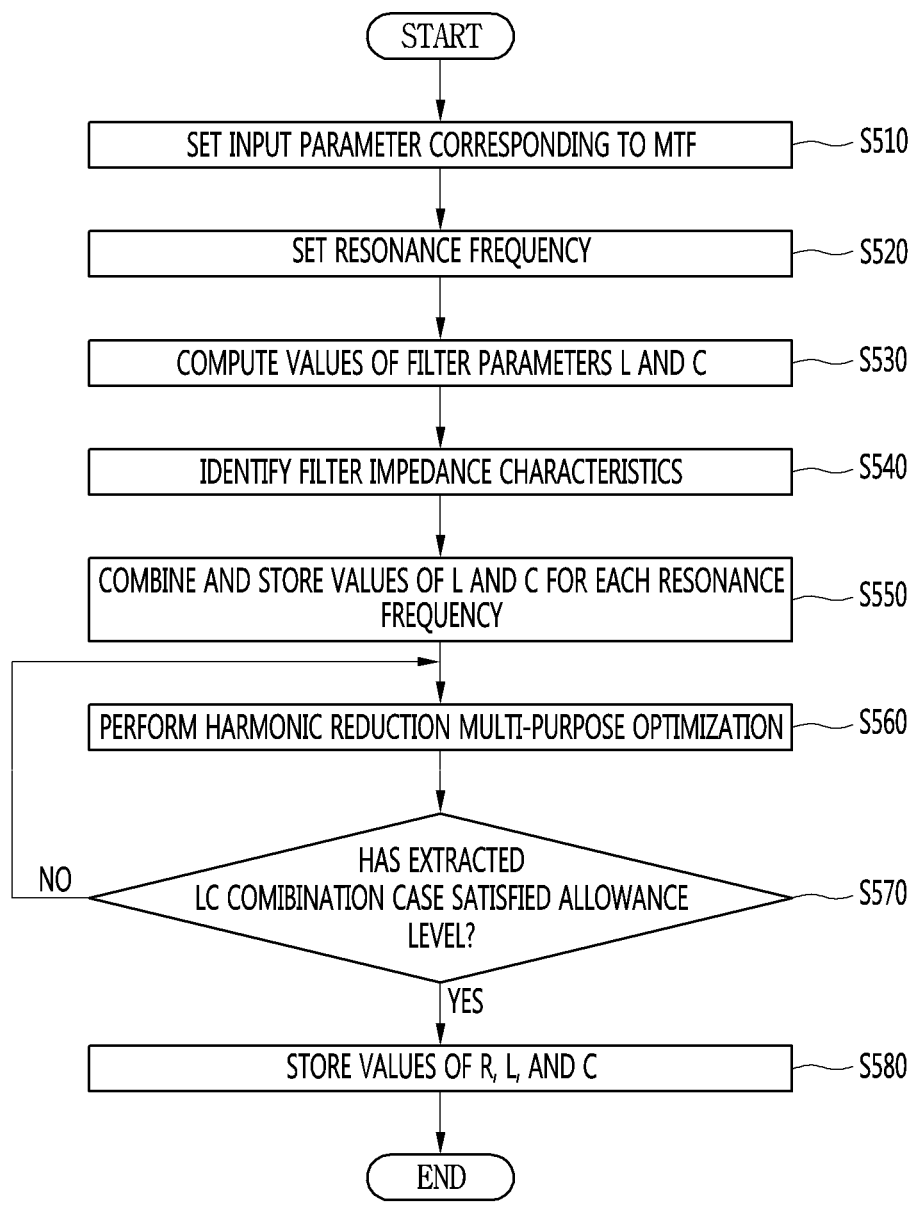

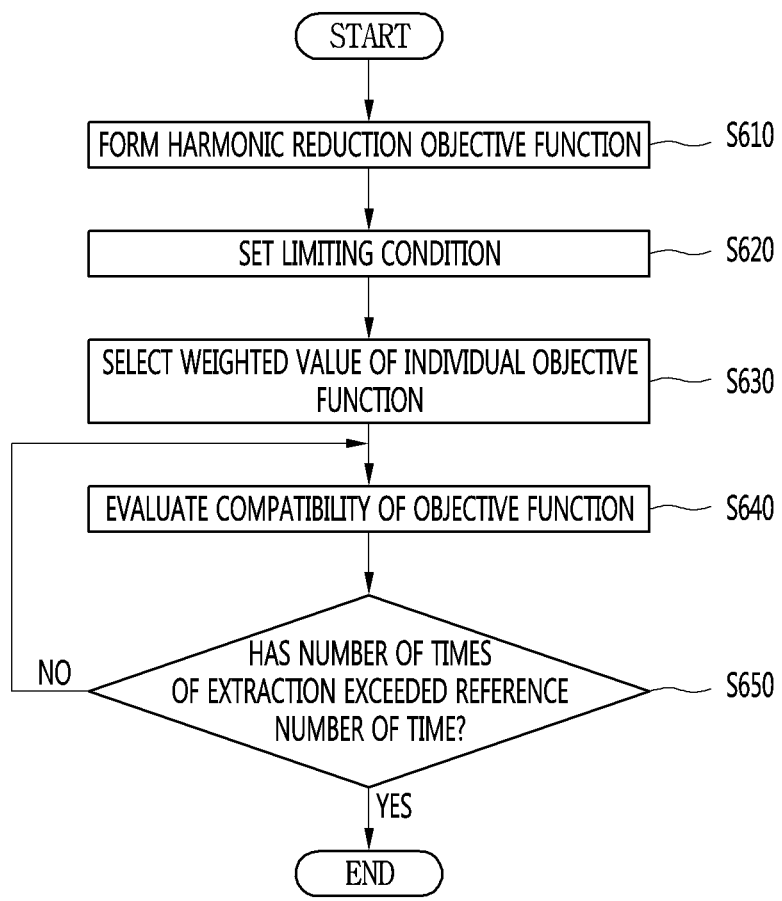

METHOD FOR DESIGNING MULTIPLE TUNED FILTER IN HIGH VOLTAGE DIRECT CURRENT SYSTEM

CROSS-REFERENCE TO RELATED APPLICATIONS

Pursuant to 35 U.S.C. § 119(a), this application claims the benefit of earlier filing date and right of priority to Korean Patent Application No. 10-2015-0108403 filed on Jul. 30, 2015, the contents of which are all hereby incorporated by reference herein in its entirety.

BACKGROUND

The present disclosure relates to a method for designing a multiple tuned filter (hereinafter, referred to as 'MTF') according to characteristics of a high voltage direct current (hereinafter, referred to as 'HVDC') system.

In a HVDC system, a harmonic filter prevents harmonics generated in power conversion through the operation of a converter from being introduced into an AC system, and also serves as a reactive power supply source in consumption of reactive power. A majority of current type HVDC systems operates with 12 pulses, and hence generates characteristic harmonics of $12n \pm 1$ orders such as 11th, 13th, 23rd, and 25th orders. Particularly, since magnitudes of 11th- and 13th-order harmonics are large, 11th- and 13th-order filters are used to decrease the magnitudes of the 11th- and 13th-order harmonics.

In the current type HVDC systems, a majority of converters operate with 12 pulses. In an 80 kV 60 MW HVDC system currently installed in Jeju, Korea, a converter is also configured as a 12-pulse converter using a serial connection of two 6-pulse groups.

In the HVDC system, a single tuned filter (STF) or double tuned filter (DTF) is widely used as the harmonic filter. Formulae for serial and parallel impedances of the filter may be used to design the filter.

The design of a filter is made by passive calculation based on design ratings or performances of passive elements included in the filter. Therefore, any accurate, efficient, and standardized manner or method does not exist.

SUMMARY

Embodiments provide an MTF according to characteristics of an HVDC system, a method for designing a damped type MTF, and a designing device.

In one embodiment, a method for designing an MTF in an HVDC system includes: setting an input parameter constituting the MTF; setting a resonance frequency of the MTF; extracting at least one LC combination case constituting the MTF on the basis of the input parameter and the resonance frequency; performing optimization for harmonic reduction on the LC combination case; and extracting an LC combination case determined based on a result obtained by performing the optimization.

According to the present disclosure, it is possible to implement an MTF in an HVDC system, which has an optimal combination of R, L, and C, which satisfies a harmonic voltage regulation value and a harmonic current allowable level by considering efficiency and harmonic reduction through the above-described method.

The details of one or more embodiments are set forth in the accompanying drawings and the description below. Other features will be apparent from the description and drawings, and from the claims.

BRIEF DESCRIPTION OF THE DRAWINGS

FIGS. 5 and 6 are flowcharts illustrating the method according to the embodiment.

DETAILED DESCRIPTION OF THE EMBODIMENTS

Figure 1:
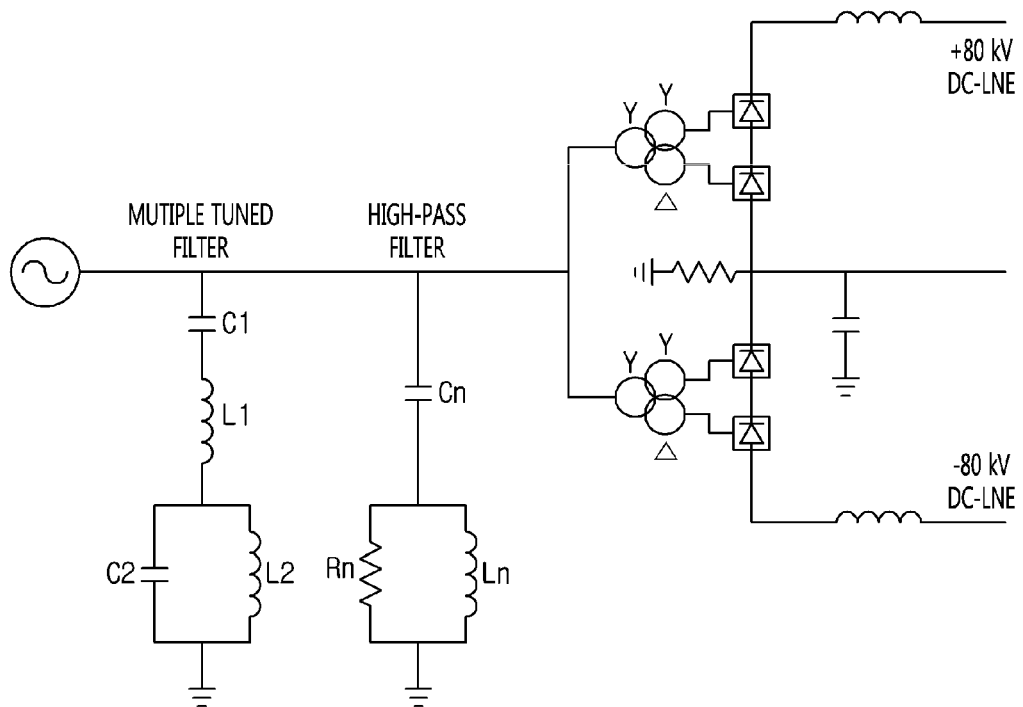
FIG. 1 is a configuration diagram illustrating a general HVDC system.

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below. In the drawings, the sizes, thicknesses and the like of devices are exaggerated for convenience of illustration. Like reference numerals indicate like elements throughout the specification and drawings.

FIG. 1 is a configuration diagram illustrating a general HVDC system.

Referring to FIG. 1, an MTF installable in an 80 kV HVDC system is illustrated in the HVDC system. The 80 kV HVDC system has a typical bi-electrode system, and is configured with a 12-pulse converter having the same two electrodes.

The converter of the HVDC system may generate a harmonic current of a specified value or more. Therefore, unless filtering is performed, the harmonic current may create distortion in an AC voltage and disturb a normal operation of the system.

A harmonic filter allows a harmonic current to flow out therethrough by forming a parallel line having small impedance, so that the harmonic current is within a range in which the distortion of an AC voltage can be permitted.

The 12-pulse converter has characteristic harmonics of $12n \pm 1$ orders. Therefore, harmonic components required in the filter may be 11th-, 13th-, 23rd-, and 25th-order components. Harmonic components of orders higher than the 11th, 13th, 23rd, and 25th orders may be attenuated by a high-pass filter.

The 80 kV HVDC system may include an MTF and a high-pass filter, which compensate for a reactive power of 17 Mvar. In the MTF, a high-voltage capacitor bank C1 and a low-voltage air core reactor L1 may be coupled in series to each other, and a low-voltage capacitor bank C2 and an air core reactor L2 may be coupled in parallel to each other. Here, the harmonic filter may function to supply reactive power to the system at 60 Hz.

Figure 2:
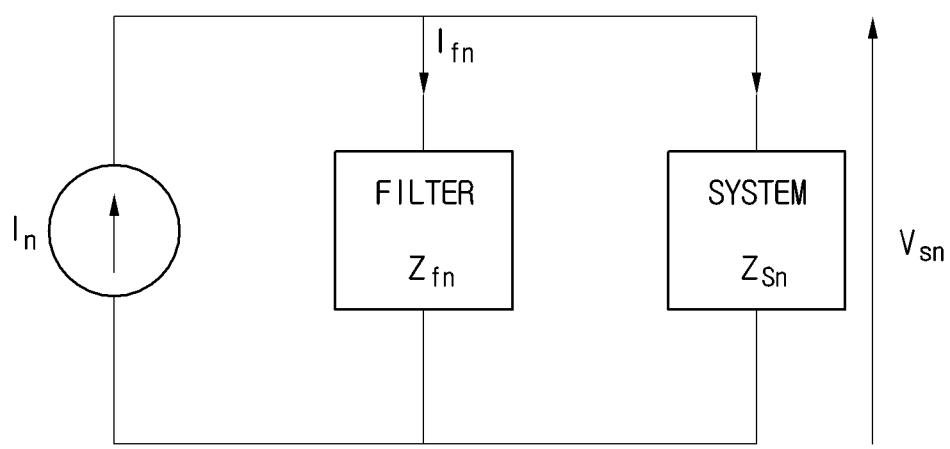
FIG. 2 is a configuration diagram illustrating a harmonic equivalent model corresponding to an HVDC system in which a harmonic filter is embedded.

FIG. 2 is a configuration diagram illustrating a harmonic equivalent model corresponding to an HVDC system in which a harmonic filter is embedded.

Referring to FIG. 2, a current type HVDC converter may absorb reactive power from an AC system and supply reactive power required in the converter through a harmonic filter.

The HVDC converter may be modeled as a constant current harmonic power source in an AC stage thereof, and may be modeled as a constant voltage harmonic power source at a DC stage thereof. The harmonic filter functions to prevent harmonics generated in the HVDC converter from being introduced into the AC system, and hence a harmonic equivalent model using a constant current harmonic power source in an AC stage thereof as shown in FIG. 2 may be used as the harmonic filter.

Here, $I_n$ denotes a harmonic current generated from the HVDC converter, and $I_{fn}$ and $I_{sn}$ denote harmonic currents introduced into the filter and the AC system, respectively. $Z_{fn}$ and $Z_{sn}$ denote harmonic impedances of the AC system, respectively, and $V_{sn}$ denotes a harmonic voltage of the AC system.

The performance of the harmonic filter depends on an admittance value of the AC system. Since the admittance value of the AC system is temporally varied depending on a state of an actual power system, it is difficult to obtain an exact admittance value at a given frequency. Therefore, in the design of a harmonic filter, admittance at a given frequency may be determined on a complex plane having an admittance angle as a boundary.

Figure 3:
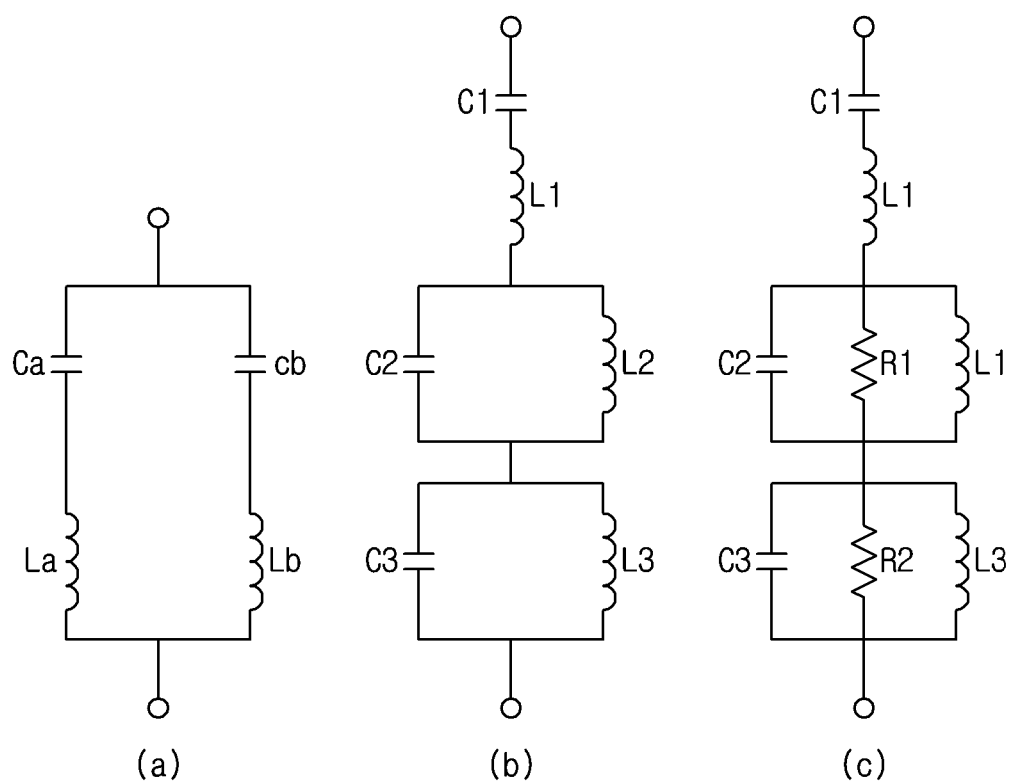
FIG. 3 is an exemplary diagram illustrating a method for designing an MTF using an equivalent circuit manner according to an embodiment.

FIG. 3 is an exemplary diagram illustrating a method for designing an MTF using an equivalent circuit manner according to an embodiment.

Referring to FIG. 3, when an AC filter (or harmonic filter) is designed in an HVDC system, it is necessary to consider harmonic distortion, system reliability, cost, etc.

In a harmonic filter, cost corresponding to one bank is generated. Hence, a harmonic filter implemented by coupling the same filter banks in parallel to each other as shown in FIG. 3(b) or 3(c) uses a smaller space in removal of the same number of harmonics than a harmonic filter using two single tuned filters (hereinafter, referred to as 'STFs') to remove two harmonics as shown in FIG. 3(a), which is economically advantageous.

In addition, the form of a damped-type MTF including a damping resistor R coupled in parallel to a parallel LC resonance tank as shown in FIG. 3(c) may be used.

The equivalent circuit manner may be a manner that can be relatively easily approached in the design of an MTF.

For the design of the MTF, the total amount of reactive power to be compensated is equally distributed to STFs, and a parameter value of each STF is selected.

When the parameter value of the STF is selected, it is required to determine the magnitude of a voltage applied to the filter and the amount of reactive power to be compensated by the filter.

Because of the structure of a serial LC filter, a capacitor and an inductor in the serial LC filter are coupled in series to each other, and therefore, the reactance of the filter may be a difference in reactance between the capacitor and inductor.

Meanwhile, the impedance of the entire filter in an hth-order harmonic is to be a value of 0, and therefore, the reactance of the capacitor is equal to a value obtained by multiplying the reactance of the inductor by the square of h.

According to the above-described method, a converter of the HVDC system generates a harmonic current of a specified value or more, and therefore, a harmonic filter is installed to allow the harmonic current to flow out therethrough, so that the harmonic current is within a range in which the distortion of an AC voltage can be permitted.

The 12-pulse converter has characteristic harmonics of $12n\pm1$ orders. Therefore, harmonic components required in the filter are 11th-, 13th-, 23rd-, and 25th-order components. Harmonic components of orders higher than the 11th, 13th, 23rd, and 25th orders may be attenuated by a high-pass filter.

As shown in an exemplary diagram of FIG. 3(b), in the MTF, a high-voltage capacitor bank C1 and a low-voltage air core reactor L1 may be coupled in series to each other, and a low-voltage capacitor bank C2 and an air core reactor L2 may be coupled in parallel to each other. In addition, the MTF may be configured by coupling in series a plurality of LC resonance tanks each configured by coupling a low-voltage capacitor bank C3 and an air core reactor L3 in parallel to each other according to harmonics to be removed.

The harmonic filter functions to supply reactive power to the system at 60 Hz. Therefore, terminals of a rectifier and an inverter absorb reactive power in proportion to active power exchanged between a converter and an AC system. Since the harmonic filter uses capacitors, it is possible to supply required reactive power to the converter. If reactive power is not sufficiently compensated from the filter, an AC voltage at the terminal may not have a sufficient magnitude for normally operating the converter.

Meanwhile, an HVDC converter is a constant voltage harmonic power source in a DC stage, and may be modeled as a constant current harmonic power source in an AC stage. Since it is one of the functions of the filter to prevent harmonics generated in the HVDC converter from being introduced into the AC system, it is required to perform modeling for harmonic analysis in the AC stage.

Here, a filter and a power system (e.g., an AC system) coupled thereto may be expressed or modeled using impedance.

A filter may be designed after a degree where a harmonic current generated in the converter is introduced into the system and harmonic characteristics of a voltage corresponding to the degree are figured out using the model of FIG. 2.

In addition, a model can be easily implemented by changing a resistance value in the filter so as to improve the stabilization of a relationship between the filter and the power system coupled thereto.

Figure 4:
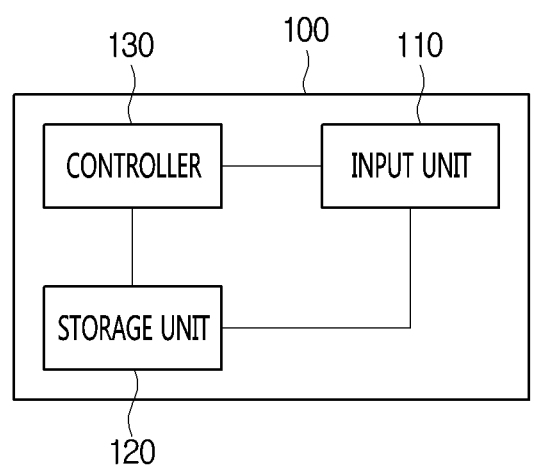
FIG. 4 is a block configuration diagram illustrating a filter parameter setting device of the MTF to which the embodiment is applied.

FIG. 4 is a block configuration diagram illustrating a filter parameter setting device of the MTF to which the embodiment is applied.

Referring to FIG. 4, filter parameter setting device 100 may include an input unit 110, a storage unit 120, and a controller 130.

The input unit 110 may function to receive an input parameter and a resistance value corresponding to the MTF.

The input unit 110 allows a user to generate input data for controlling an operation of the filter parameter setting device 100. The input unit 110 may be configured as a keypad, a dome switch, a touch pad, a jog wheel, a jog switch, or the like.

Also, the input unit 110 may function to interface with all external devices coupled to the filter parameter setting device 100.

The storage unit 120 may store processing of the controller 130 and a program for control. The storage unit 120 may function to arbitrarily store input/output data (input parameters and resistance values) and result data calculated and computed by the controller 130 or store them as final result data. According to an embodiment, the storage unit 120 may store information on a weighted value of an individual objective function and data on combinations of L and C as filter components. Also, the storage unit 120 may store information on evaluation for forming a filter having an optimal combination of L and C to which the weighted value of the individual objective function is applied and information on a number of times of the evaluation.

The controller 130 may function to control the general operations of the filter parameter setting device 100, which are performed in the filter parameter setting device 100.

The controller 130 may be implemented in the form of a microcontroller or microprocessor. The controller 130 may set a resonance frequency corresponding to the MTF and a resistance value within a preset reference range. Also the controller 130 may set a parameter value corresponding to the MTF, based on the input parameter, the resonance frequency, and the resistance value.

The controller 130 may determine whether an individual harmonic component or a total harmonic distortion ratio satisfies a reference value level, and reset the resonance frequency based on a determination result.

The controller 130 may set or reset the resistance value within the preset range as a load or system is coupled to the MTF, thereby ensuring safety.

The controller 130 creates a harmonic reduction objective function, and enables a harmonic voltage or harmonic current to be maximally reduced according to the created objective function. Accordingly, it is possible to design an MTF according to weighted value application and compatibility evaluation.

Hereinafter, based on the above-described configuration, the method according to the embodiment will be described in detail with reference to FIGS. 5 and 6.

FIGS. 5 and 6 are flowcharts illustrating the method according to the embodiment.

Referring to FIGS. 5 and 6, in the design of an MTF, an input parameter corresponding to the MTF may be set (S510). Specifically, an input parameter corresponding to the MTF may be set when an optimal parameter corresponding to the MTF is set. The input parameter may be a parameter related to the rating or target performance of the MTF. Also, the input parameter may include at least one of a rated voltage of a load or system coupled to the MTF, reactive power to be compensated by the MTF, and a filtering frequency.

The load or system coupled to the MTF may be a power system of an HVDC system. The power system of the HVDC system may be, for example, an AC system.

The filtering frequency is a frequency to be filtered by the MTF, and may include a first filtering frequency and a second filtering frequency greater than the first filtering frequency.

For example, when harmonic components to be filtered are the above-described 11th- and 13th-order harmonic components, the first filtering frequency may be a frequency corresponding to the 11th-order harmonic component, and the second filtering frequency may be a frequency corresponding to the 13th-order harmonic component.

If the input parameter corresponding to the MTF is set, a resonance frequency of the MTF may be set (S520). Specifically, the set resonance frequency may set an initial value of the resonance frequency, and the setting of the resonance frequency may be performed based on the filtering frequency to be filtered by the MTF.

For example, the resonance frequency may be set as a frequency that exists within a range between the first and second filtering frequencies. Specifically, the initial value of the resonance frequency may be set as the first filtering frequency.

If the setting of the resonance frequency is completed, values of L and C that become filter parameters forming impedance of a filter to be matched to the resonance frequency may be computed (S530).

For example, the MTF may include a first LC circuit unit, a second LC circuit unit, and a third LC circuit unit, which are coupled in series to each other. The first LC circuit unit may have a structure in which a first capacitor and a first inductor are coupled in series to each other, and the second LC circuit unit may have a structure in which a second capacitor and a second inductor are coupled in parallel to each other. The third LC circuit unit may have a structure in which a third capacitor and a third inductor are coupled in parallel to each other.

In this case, the filter parameter may include at least one of a capacitance value of the first capacitor, an inductance value of the first inductor, a capacitance value of the second capacitor, an inductance value of the second inductor, a capacitance value of the third capacitor, and an inductance value of the second inductor. In addition, the resonance frequency of the filter may be a parallel resonance frequency corresponding to the second and third LC circuit units.

Filter impedance characteristics of the computed values of L and C are identified (S540), and values of L and C according to the identified filter impedance characteristics may be combined and stored for each resonance frequency (S550). Specifically, cases where the identified filter impedance is included in a preset reference value range may be matched to the values of L and C for each resonance frequency, and the matched cases may be stored. The LC combination may be created as one or more various cases.

Harmonic reduction multi-purpose optimization may be performed on the LC combination for each resonance frequency (S560). Specifically, in the harmonic reduction multi-purpose optimization, an operation for selecting an optimal filter component combination obtained by considering a total harmonic distortion (THD) and a total demand distortion of current (TDD) may be performed on a plurality of combined cases created by the LC combination. The operation for the harmonic reduction multi-purpose optimization will be described in detail with reference to FIG. 6.

A harmonic reduction objective function may be formed to perform the harmonic reduction multi-purpose optimization (S610). Specifically, the harmonic reduction objective function may be configured with a first objective function and a second objective function.

The first objective function is a function having the THD as a minimum, and may maximally reduce a harmonic voltage.

The first objective function may be represented as shown in the following Equations 1 and 2.

$$F_1 = \min THD = \min \sqrt{\sum_{i=2}^{50} \left(\frac{V_i}{V_2}\right)^2} \quad \text{Equation 1}$$

$$V_1 = \frac{I_i}{Y_{si} + \sum Y_{MTFi}} \quad \text{Equation 2}$$

Here, i is a harmonic number, $V_1$ is a fundamental harmonic voltage, $V_i$ is an i-th harmonic voltage, $Y_{si}$ is an i-th harmonic admittance of the system, and $Y_{MTFi}$ is MTF's i-th harmonic admittance.

That is, the first objective function $F_1$ may calculate a minimum THD on the basis of harmonic voltages of secondary to 50th-order harmonics.

The second objective function is a function having the TDD as a minimum, and may maximally reduce a harmonic current.

The second objective function may be represented as shown in Equation 3.

$$F_2 = \min TDD = \min \sqrt{\sum_{i=2}^{50} \left(\frac{I_i}{I_2}\right)^2} \quad \text{Equation 3}$$

Here, i is a harmonic number, $I_1$ is a fundamental harmonic voltage, and $I_i$ an i-th harmonic current.

That is, the second objective function $F_2$ may calculate a minimum TDD on the basis of harmonic currents of the secondary to 50th-order harmonics.

If a harmonic reduction objective function including the calculated THD and TDD is created, a limiting condition to be applied to the objective function may be set (S620). Specifically, a reactive power demand of the filter may be selected as the limiting condition. The limiting condition may additionally include price information or loss information based on the price and number of each of Rs, Ls, and Cs, which constitute the filter. Therefore, secondary filtering may be performed on optimal LC combination cases on the basis of the price information or loss information.

If the limiting condition to be applied is selected in addition to the individual objective functions as described above, a weighted value for each of the objective functions may be selected (S630). Specifically, the weighted value W may be configured with a first weighted value W1 to be applied to the first objective function $F_1$ and a second weighted value W2 to be applied to the second objective function $F_2$. The weighted value W may be a sum of the first weighted value W1 and the second weighted value W2 as shown in the following Equation 4.

Total weighted value (W)=first weighted value (W1)+second weighted value (W2)     Equation 4

Preferably, the total weighted value W, i.e., the sum of the first weighted value W1 and the second weighted value W2 may be 1, and the ratio of the first and second weighted values W1 and W2 respectively applied to the first and second objective functions $F_1$ and $F_2$ may be varied depending on a harmonic voltage regulation value and a harmonic current allowable level.

For example, in the design of an MTF, if only the harmonic voltage regulation value exists, the ratio of the first weighted value W1 applied to the first objective function may be set to "1," and the ratio of the second weighted value W2 applied to the second objective function may be set to "0." Alternatively, if only the harmonic current allowable level exists, the ratio of the first weighted value W1 applied to the first objective function may be set to "0," and the ratio of the second weighted value W2 applied to the second objective function may be set to "1." That is, the second weighted value W2 to be applied to the second objective function may be set to be higher than the first weighted value W1. Alternatively, if both the harmonic voltage regulation value and the harmonic current allowable level exist, the ratios of the first and second weighted values to be respectively applied to the first and second objective functions may be equally applied.

The above-described ratio of the weighted value applied to the objective function is described as an example, and the ratio of the weighted value applied to the objective function may be set to be varied depending on a weighted value selection reference and a weighted degree of each objective function.

The compatibility of the first and second objective functions $F_1$ and $F_2$ to which the respective weighted values are applied may be evaluated (S640). Specifically, the first and second weighted values W1 and W2 may be respectively applied to the first and second objective functions $F_1$ and $F_2$ according to the harmonic voltage regulation value and the harmonic current allowance level, and units are integrated with respect to the first and second objective functions $F_1$ and $F_2$ to which the respective weighted values are applied, thereby performing compatibility evaluation.

The compatibility evaluation may extract a combination case of which result value has a minimum in a state in which objective functions and weighted values are respectively applied to LC combination cases. At this time, a plurality of LC combination cases may be extracted from the LC combination cases in an order in which they have minimum values according to a compatibility evaluation reference (primary filtering), and secondary filtering for extracting an optimal LC combination case according to price information or loss information among preset limiting conditions may be performed.

Therefore, LC combination cases may be extracted in an order in which they have minimum values by computing a single objective function using a sum of the first and second objective functions to which the respective weighted values are applied.

After the compatibility evaluation is completed, if the number of times of extracting combination cases of R, L, and C exceeds a reference number of times, and a combination case having the minimum compatibility is extracted, the multi-purpose optimization may be ended (S650). The number of times of extraction may be the number of combination cases of R, L, and C.

Therefore, if the multi-purpose optimization is ended, it is determined whether the extracted LC combination case satisfies the allowance level on the basis of performance, standard, or design specifications, which is required in the MTF (S570).

When it is determined that the extracted LC combination case satisfies a preset allowance level, the extracted R, L, and C and a resonance frequency matched thereto may be stored (S580).

Thus, the MTF is coupled to a load or system, based on a resistance value combined through the above-described processes.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for designing a multiple tuned filter (MTF) in a high voltage direct current (HVDC) system, the method comprising:

setting an input parameter corresponding to the MTF, using a microprocessor;

setting a resonance frequency of the MTF;

extracting at least one LC combination case constituting the MTF on a basis of the input parameter and the resonance frequency;

performing optimization for harmonic reduction on the LC combination case by computing a first objective function having a total harmonic distortion (THD) as a minimum, and computing a second objective function having a total demand distortion of current (TDD) as a minimum; and extracting an LC combination case determined based on a result of performing the optimization, such that the extracting of the LC combination case is based on the first objective function and the second objective function.

2. The method according to claim 1, wherein the extracting of the LC combination case comprises:

respectively applying preset weighted values to the computed first and second objective functions; and extracting the LC combination case having a minimum value according to the first and second objective functions to which the respective weighted values are applied.

3. The method according to claim 2, wherein the weighted values comprise a first weighted value for a harmonic voltage regulation value applied to the first objective function and a second weighted value for a harmonic current allowable level applied to the second objective function.

4. The method according to claim 1, further comprising performing compatibility evaluation on the extracted LC combination case.

5. The method according to claim 1, further comprising selecting the first objective function and the second objective function, and setting a limiting condition to be applied to each of the first and second objective functions.

6. The method according to claim 5, wherein the limiting condition comprises a reactive power demand of the MPF or price information on each of L and C, which constitute the MPF.

7. The method according to claim 5, wherein the limiting condition comprises a reactive power demand of the MPF or loss information on each of L and C, which constitute the MPF.

8. The method according to claim 1, further comprising combining a value of a resistor (R) with the LC combination case determined based on the result of performing the optimization.

* * * * *